(12) United States Patent
Tian

(10) Patent No.: US 12,074,481 B2
(45) Date of Patent: Aug. 27, 2024

(54) MOTOR-DRIVEN POWER BOARD AND A MOTOR DRIVER USING THE SAME

(71) Applicant: Autoflight (Kunshan) Co., Ltd., Kunshan (CN)

(72) Inventor: Yu Tian, Hong Kong (CN)

(73) Assignee: AUTOFLIGHT (KUNSHAN) CO., LTD., Jiangsu Province (CN)

( * ) Notice: Subject to any disclaimer, the term of this patent is extended or adjusted under 35 U.S.C. 154(b) by 9 days.

(21) Appl. No.: 18/193,489

(22) Filed: Mar. 30, 2023

(65) Prior Publication Data

US 2023/0318409 A1    Oct. 5, 2023

(30) Foreign Application Priority Data

Mar. 30, 2022   (CN) .......................... 202220725976.5

(51) Int. Cl.
*H02K 11/33*    (2016.01)
*H02K 5/22*    (2006.01)
*H02K 11/30*    (2016.01)

(52) U.S. Cl.
CPC ............. *H02K 11/33* (2016.01); *H02K 5/225* (2013.01); *H02K 11/30* (2016.01); *H02K 2211/03* (2013.01)

(58) Field of Classification Search
CPC .... H02K 5/225; H02K 2211/03; H02K 11/33; H02K 11/30; H02K 11/38
USPC .................................................. 310/71, 68 R
See application file for complete search history.

(56) References Cited

U.S. PATENT DOCUMENTS

| 11,437,922 B2* | 9/2022 | Abdalla | ................ H02M 7/003 |
| 2019/0280611 A1* | 9/2019 | Chung | ............... H05K 7/14329 |

FOREIGN PATENT DOCUMENTS

CN    112511066 A   *  3/2021   ............. H02M 1/44

OTHER PUBLICATIONS

Gu et al., Motor Controller, Mar. 16, 2021, CN 112511066 (English Machine Translation) (Year: 2021).*

* cited by examiner

*Primary Examiner* — Alexander A Singh
(74) *Attorney, Agent, or Firm* — WPAT LAW, P.C.; Anthony King

(57) ABSTRACT

A motor-driven power board having a PCB and a plurality of transistors uniformly arranged along the edge of the PCB and a plurality of capacitors uniformly arranged along the inner side of the transistor. There is a plurality of terminals uniformly arranged along the inner side of the transistor. The board further includes a positive pole of power bus, a negative pole of power bus and a signal wire which are all located in the middle of the PCB. The invention improves the heat dissipation and current-sharing capacity of the power board by uniformly setting the power components from the inside to the outside according to the heat value while at the same time reduces the heat value in the middle of the power board, so that the motor of the driver using the power board can be assembled near the middle of the power board.

7 Claims, 2 Drawing Sheets

US 12,074,481 B2

MOTOR-DRIVEN POWER BOARD AND A MOTOR DRIVER USING THE SAME

FIELD OF THE DISCLOSURE

The invention relates to the technical field of drivers, in particular to a motor-driven power board and a motor driver.

BACKGROUND OF THE INVENTION

The existing electric vehicle motor controller power board is relatively simple, most of which are rectangular, one side is the drive IC, the other side is the power semiconductor, and the three-phase line is led out by a window at the board side. Although this structural layout meets the needs of small UAVs and is easy to assemble on the wings, it is not conducive to heat dissipation. The high rise of temperature of power semiconductors limits its performance, resulting in low power density. Due to the heavy weight of large aircraft, the power system needs more power to output, and the disadvantages of this conventional layout are particularly prominent.

SUMMARY OF THE INVENTION

The invention aims to provide a motor-driven power board with good heat dissipation and satisfying effects in distributing current-sharing capacity equally, with easy assembly.

Another purpose of the invention is to provide a motor driver, which adopts air-cooled heat dissipation with compact structure, small size and light weight.

To solve the above technical problem, the present invention provides a motor-driven power board, including a PCB board, further includes: a plurality of transistors that may be uniformly arranged along the edge of the PCB board, a plurality of capacitors that may be located on the PCB board and can be uniformly arranged along the side of the transistor near the center of the PCB board.

There can be a plurality of terminal posts located on the PCB board and can be uniformly arranged along the side of the transistor near the center of the PCB board, and can be arranged between the two adjacent capacitors.

There can be a positive pole of power bus, a negative pole of power bus and a signal wire, all of which can be located in the middle of the PCB board.

As a preferred option for motor-driven power board, the transistor can be vertically placed on the plane of the PCB board, and the heat dissipation surface of the transistor can be perpendicular to the plane of the PCB board. Further, the heat dissipation surface of the transistor can face the periphery of the PCB board.

As a further preferred option for motor-driven power board, the PCB board can have a hexagonal structure or a circular structure. The transistor and the capacitor can be symmetrically distributed with the center of the PCB as the origin.

As a further preferred option for motor-driven power board, a conductive strip is welded on the copper clad wire connecting the transistor and the terminal posts.

As a further preferred option for motor-driven power board, the conductive strip can be uniformly arranged along the inner side of the transistor and the outer side of the capacitor.

As a further preferred option for motor-driven power board, the transistor, the conductive strip and the capacitor, all of which can be symmetrically distributed with the center of the PCB board as the origin.

As a further preferred option for motor-driven power board, the conductive strip can be arranged on both the front and the back sides of the PCB board. The conductive strip is relatively arranged on both the front and the back sides of the PCB board.

As a further preferred option for motor-driven power board, the conductive strip is tinned copper strip; the tinned copper strip is bonded with the copper clad wire.

As a further preferred option for motor-driven power board, each terminal post can be connected with two bridge arms, and the bridge arms can be composed of multiple transistors with the same number in parallel.

The current disclosure also provides a motor driver comprising a motor and the motor-driven power board in any of the embodiments described herein. The motor can be close to the middle of the motor-driven power board and is electrically connected to the terminal post on the PCB board. The motor driver can be provided with an air flow channel to provide air flow for heat dissipation for the power components on the PCB board.

At least one of the enclosed embodiments can have any one of the below beneficial effects:

1. The motor-driven power board can have power components that are uniformly set from the inside to the outside according to the heat value to avoid heat concentration in the middle of the power board, which is conducive to improving the heat dissipation capacity and current-sharing capacity of the power plate.

2. The motor-driven power board provided by this invention can reduce the heat output in the middle of the power board by setting the components with high heat output at the outer edge of the power board, so that the motor of the driver can be assembled close to the middle of the power board, thereby reducing the difficulty and volume of the driver assembly.

3. In the motor driver provided by this invention, the motor is close to the middle of the power board with low calorific value, and the power component at the outer edge of the power board ensures heat dissipation through convective air. Compared with a water-cooled heat dissipation method, the design greatly reduces the complexity of the structure of the motor driver, and improves the compactness of the structure of the motor driver, thus reducing the cost, volume and weight of the driver and aircraft.

Figure 1:
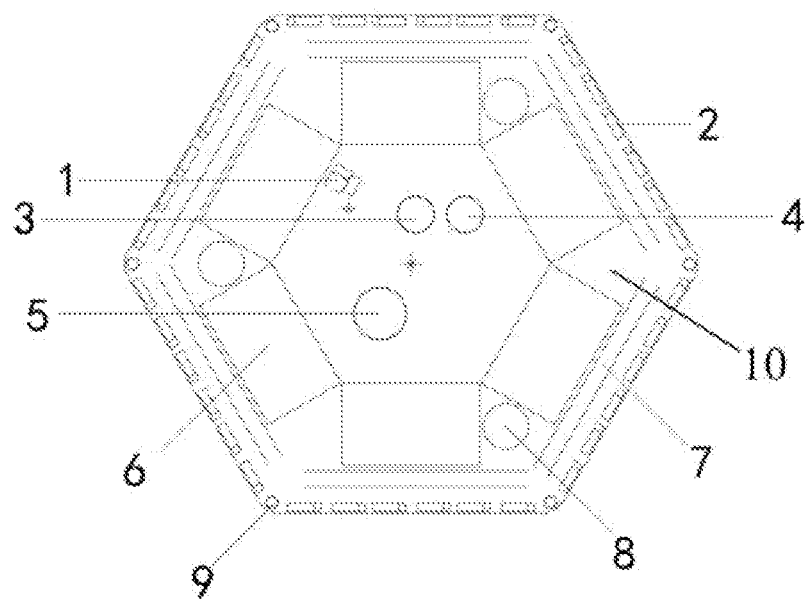
FIG. 1 is the front structure diagram of the motor-driven power board of one embodiment of the disclosure.

10—PCB board; 1—RC absorption circuit; 2—transistor; 3—positive pole of power bus; 4—negative pole of power bus; 5—signal wire; 6—capacitor; 7—conductive strip; 8—terminal post; 9—mounting hole.

DETAILED DESCRIPTION

The invention is further described in detail with the attached drawings and embodiments. It can be understood that the specific embodiments described herein are only used to explain the invention, not to limit the invention. In addition, it should be noted that for the convenience of description, the attached drawings only show part of the structure related to the invention, not the whole structure.

In the description of the invention, the terms "connected", and "fixed" should be understood in a broad sense unless otherwise specified and limited, for example, they can be fixed connections, detachable connections, or integrated; It can be mechanical connection or electrical connection. It can be directly connected, or indirectly connected through intermediate media, or it can be the internal connection of two components or the interaction between two components. For those skilled in the art, the specific meaning of the above terms in the invention can be understood in a specific case.

In this invention, unless otherwise specified and defined, the first feature in the "up" or "down" of the second feature can include the direct contact between the first and second features, or the contact between the first and second features is not direct contact but through other features between them. Moreover, the first feature is "above" the second feature, including the first feature is directly above and diagonally above the second feature, or only indicates that the horizontal height of the first feature is higher than the second feature. The first feature "below" of the second feature include the first feature directly below and diagonally below the second feature, or only indicate that the horizontal height of the first feature is less than the second feature.

In the description of this embodiment, the terms "up", "down", "right", and other orientation or position relations are based on the orientation or position relations shown in the attached drawings, which are only for the convenience of description and simplified operation, rather than indicating or implying that the device or element referred to must have a specific orientation, be constructed and operated in a specific orientation, so they cannot be understood as restrictions on the invention. In addition, the terms "first" and "second" are only used to distinguish between descriptions and have no special meaning.

In the existing technology, in order to ensure heat dissipation, most of the power components are distributed on the power board. Therefore, due to the limitation of the board surface, it is difficult to keep the different phase circuits on the power board consistent during wiring, resulting in different impedance and heat generation of the current circuit of each bridge arm, forming a wooden barrel phenomenon, that is, the performance of the power board is determined by the bridge arm circuit with the highest heat generation. If the transistor 2 on the bridge arm exceeds the bearing temperature when the power is high, thus triggering the temperature protection and reducing the performance release of transistor 2, and even causing the direct failure of transistor 2.

At the same time, due to the volume limitation of the electric vehicle, it is difficult to maintain sufficient distance between the power board and the motor for heat dissipation, and the aircraft needs a large output power. Therefore, in order to prevent the performance of the power components from being affected by excessive heat, most of the power boards need to be equipped with separate water cooling devices for heat dissipation, and the setting of the water cooling device has greatly increased the volume and weight of the electric vehicle and the service performance of the electric vehicle. At the same time, the complexity and manufacturing cost of the electric vehicle are increased.

Therefore, this embodiment provides a motor-driven power board with good heat dissipation and current-sharing capacity. At the same time, the power board can be installed with the electric vehicle motor, and the installation structure is compact. The installed power board can be cooled by air cooling, which can greatly reduce the volume and weight of the driver and the aircraft.

As shown in FIG. 1, the motor-driven power board in this embodiment includes a PCB board 10, a transistor 2, a capacitor 6 and a terminal post 8 of three phase lines, a positive pole of power bus 3 and a negative pole of power bus 4 connected to the positive and negative poles of the DC power supply of the driver, and a signal wire 5 connected to the control terminal of the driver or control module such as the control board to transmit control signals. In the power board, the transistor 2 is uniformly arranged along the edge of the PCB 10, the capacitor 6 is located on the PCB 10 and uniformly arranged along the side of the transistor 2 near the center of the PCB 10, the terminal 8 is located on the PCB 10 and uniformly arranged along the side of the transistor 2 near the center of the PCB 10, and is arranged between the two adjacent capacitors 6. The board further includes a positive pole of power bus 3, a negative pole of power bus 4 and a signal wire 5 which are all set in the middle of the PCB board 10.

The motor-driven power board provided by this embodiment can disperse the heat as much as possible and avoid the heat concentration inside the PCB 10 by arranging the power component transistor 2 and capacitor 6 from the inside to the outside according to the heat value, and setting the small heat value positive pole of power bus 3, negative pole of power bus 4 and signal wire 5 in the middle of the PCB 10, so as to improve the heat dissipation ability of the power board. At the same time, the transistor 2 and the terminal post 8 are evenly distributed along the edge of the PCB board 10, so that the transistor 2 and the terminal 8 as the main current circuit in the circuit board can be evenly routed in the form of spokes, reducing the current and heat difference on each phase circuit, and ensuring the current-sharing capacity of the power board. In addition, in this embodiment, the main heat source and noise interference source are distributed at the board edge, which can also reduce the interference to the circuit inside the board. The middle of the power board is also provided with an RC absorption circuit 1 for anti-interference.

The motor-driven power board provided by this embodiment has a very low heat flux in the middle of the power board by setting the power components at the outer edge of the power board. Therefore, when assembling the driver, the motor of the driver can be installed near the middle of the power board, while the edge of the power board with high heat flux is distributed in the outer ring of the motor. The gas flux at the edge of the power board can be guaranteed through the hollow structure to achieve the purpose of heat dissipation.

Referring to FIG. 1, as a preferred solution, in this embodiment, the PCB board 10 selects a regular hexagon structure or a circular structure, preferably a regular hexagon structure that is more convenient for processing, and is a double-sided PCB board structure. The regular hexagon structure can be close to a circular shape, which is convenient for matching with the motor installation and air duct heat dissipation. The material of PCB board 10 can be aluminum substrate, copper substrate, ceramic substrate with better thermal conductivity and new composite substrate as required. In this embodiment, the six corners of the PCB board 10 are provided with chamfers, and the six corners are provided with mounting holes 9 for the assembly and fixation of the PCB board 10.

Optionally, in this embodiment, the terminal post 8 of each phase and its corresponding transistor 2 are connected on the PCB board 10 through a copper-coated wire. Since the main current circuit of the power board is between the transistor 2 and the terminal post 8, and the heat generation is high, in this embodiment, a conductive strip 7 is welded on the copper-coated wire connecting the transistor 2 and the terminal post 8. The conductive strip 7 has a certain width and thickness, which can increase the cross-sectional area of the current conductor, and improve the overcurrent capacity and reduce the heat value. At the same time, the conductive strip 7 and transistor 2 with higher heat value are evenly distributed at the edge of the PCB board 10 to reduce the heat value in the middle of the power board.

Figure 2:
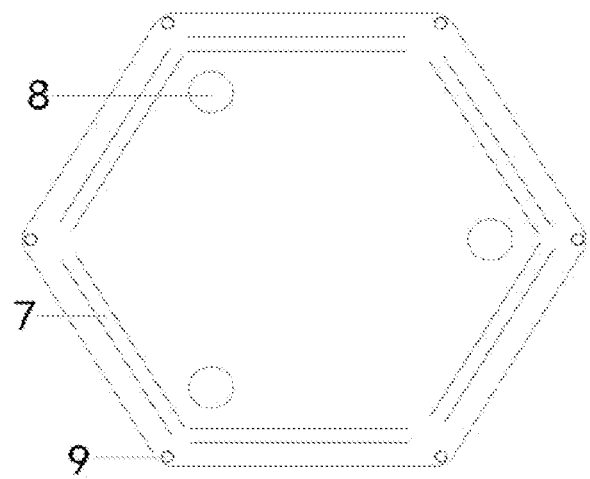
FIG. 2 is the back structure diagram of the motor-driven power board of one embodiment of the disclosure.

Referring to FIG. 1 and FIG. 2, as the preferred solution, in this embodiment, conductive strips 7 are attached to both sides of the front and back of the PCB 10, and the positions of the conductive strips 7 attached to both sides of the front and back of the PCB 10 are correspondingly arranged. Specifically, the conductive strip 7 selects rectangular tinned copper strip. More specifically, in this embodiment, a single rectangular tinned copper strip is 23 mm long, 6 mm wide and 1.5 mm thick. In this embodiment, the tinned copper bar and the copper clad wire are connected and fixed by the way of integral patch welding on the PCB board 10 by opening a window and adding tin, which reduces the processing difficulty and makes the tinned copper bar and the copper clad wire fully fit.

In this embodiment, by setting a conductive strip 7 on the copper-coated wire, the cross-sectional area of the high-current conductor is increased, the internal resistance of the conductor is reduced, the over-current capacity of the conductor is improved, and the heating capacity of the conductor is reduced. At the same time, the current conductor is changed from the copper-coated wire covered under the solder mask to the tinned copper strip that can be exposed, which can reduce its heating capacity while improving its heat dissipation capacity. In addition, it is able to reserve enough area of PCB board 10 to expand the width of copper-clad wire for the wire section without conductive strip 7 on the line, so that the power board can obtain higher volume utilization and power density on the premise of ensuring the overcurrent capacity and heat dissipation capacity. For example, in this embodiment, the volume of the large aircraft motor driver is 240 mm*209.8 mm*60 mm, the bus voltage input is 288V to 405V, the peak output current of each phase can reach 500 A, and the energy density is much higher than that of the general motor-driven power board.

Continue to refer to FIG. 1, in this embodiment, the transistor 2, the conductive strip 7 and the capacitor 6 are evenly arranged from the outside to the inside according to the heat value of the layer, and the heat value of the power board is gradually increased from the inside to the outside, so as to further ensure the heat dissipation effect of the power board.

Optionally, in this embodiment, the transistor 2 selects the insulated double-gate transistor (IGBT) with low EMI. The transistor 2 can be vertically placed at the edge of the PCB board 10, so that its heat dissipation surface is perpendicular to the plane of the PCB board 10, and the heat dissipation surface faces the periphery of the PCB board 10, so as to facilitate the heat dispersion outside the PCB board 10. In practical use, the heat dissipation surface is either the side of the wafer of transistor 2 as a power semiconductor, the side of the metal heat dissipation surface of transistor 2, or the side with the largest area of transistor 2.

As a preferred solution, in this embodiment, the DC support capacitor (DC_Link) is selected for capacitor 6. The capacitor 6 is arranged in a way that the head is adjacent to the tail. A fan-shaped horn is formed between adjacent capacitors 6. The positive pole of capacitor 6 is connected with the positive pole of power bus 3, and the negative pole is connected with the negative pole of power bus 4. The terminal post 8 is located in the fan-shaped horn formed by two adjacent capacitors 6. In addition to the heat dissipation requirement, it also needs to consider the volume of the location of capacitor. The capacitor 6 is concentrated in the inner ring so that it can use the standard packaging DC-LINK capacitor with larger volume without the need to customize the capacitor 6. The DC-LINK capacitor capacity and discharge capacity are large, which can provide margin.

As another preferred solution, in this embodiment, the terminal post 8 is a cylindrical gold-plated copper head, and the terminal post 8 penetrates the front and back sides of the PCB board 10. The gold-plated copper head is used to replace the existing connection method of windowing and welding at the edge of the board, which can reduce its heat generation and manufacturing difficulty, and facilitate the disassembly and connection between the power board and the motor.

Continue to refer to FIG. 2, in this embodiment, the capacitor 6, the conductive strip 7 and the transistor 2 are divided into 6 groups with the same composition structure. The six groups of composition structure take the center of the PCB board 10 as the origin, and the two adjacent 60° fan-shaped arrangements are distributed on the six edges of the PCB board 10, so that the capacitor 6, the conductive strip 7 and the transistor 2 form a central symmetrical overall layout. Specifically, in this embodiment, the number of capacitors 6 is 6, the number of conductive strips 7 is 6, and the number of transistors 2 is 36. The bridge arm composed of one capacitor 6, one conductive bar 7, and six parallel transistors 2, as a group of composition structures. The entire power board consists of six composition structures. In this embodiment, the central symmetry layout can further improve the consistency of the three-phase and 6-leg current circuits of the power board and ensure the current-sharing capacity of the power board.

Figure 3:
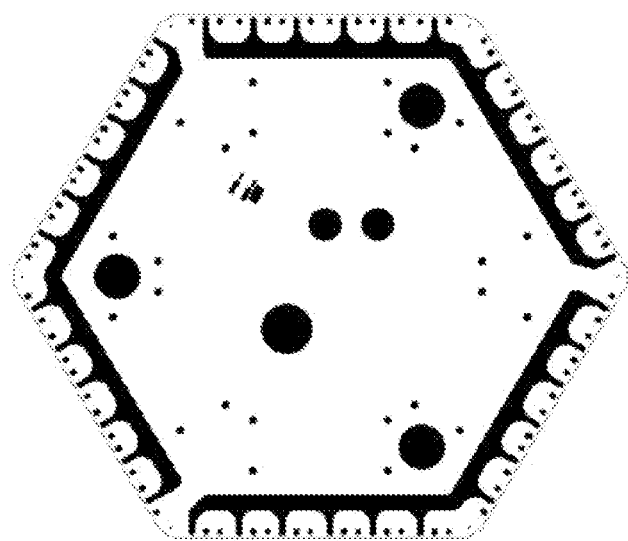
FIG. 3 is a schematic diagram of the front window opening area of the motor-drive power board of one embodiment of the disclosure.
Figure 4:
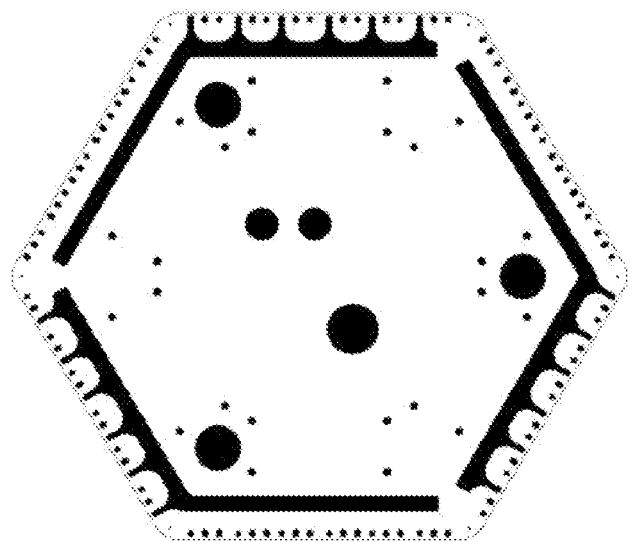
FIG. 4 is a schematic diagram of the window opening area at the back of the motor-drive power board of one embodiment of the disclosure.

Referring to FIG. 3 and FIG. 4, in this embodiment, the six bridge arms on the power board are composed of multiple transistors 2 in parallel. The two adjacent bridge arms are connected end to end through the conductive strips 7. The terminal post 8 is located in the inner circle of the junction of the two groups of conductive strips 7, which is connected to the junction of the two adjacent bridge arms. The terminal post 8 of each phase is connected to the drive motor, and the two ends of the two connected bridge arms are connected to the positive pole of power bus 3 and the negative pole of power bus 4 respectively. The on-off of the three-phase bridge arm can be controlled by transistor 2. The transistor 2 is controlled by the drive control module and can selectively control the connection or disconnection of the terminal post 8 and the drive DC power module. In this embodiment, the bridge arm formed by the parallel connection of multiple transistors 2 can play the role of current shunt, thus reducing the heat output of a single transistor 2 and avoiding the failure of transistor 2 due to overheating.

This embodiment also provides a motor driver, which includes a motor and the above motor drive power board, and the motor is located on the back side of the PCB board 10, close to the middle of the motor-driven power board, and electrically connected to the terminal post 8 on the back of the PCB board 10. Preferably, the end size of the motor is smaller than the area of the power board, and the outer edge of the power board is located on the outer ring of the motor. The periphery of the motor driver is provided with a hollow structure, which connects the inside and outside of the driver to form a channel for air supply flow. During the movement of the aircraft, the air flow enters the internal cavity of the driver through the air flow channel, flows through the edge position of the power board, and carries out heat exchange with the power component to achieve the purpose of cooling the edge of the power board.

The motor driver, by setting the power component with high heat value at the outer edge of the power board, makes the central heating capacity of the power board extremely low. Therefore, when assembling the driver, the motor of the driver can be installed near the middle of the power board, and the power component distributed at the outer edge of the power board can ensure the gas flow at the edge of the power board through the hollow structure, so as to achieve the purpose of heat dissipation. The power component has the largest distribution circumference on the power board, and the edge position has a weak blocking effect on the air flow. Therefore, in this embodiment, the temperature of the power board can be kept within the reliable operating range by relying on the convection formed during the flight of the aircraft, to replace the existing water-cooled heat dissipation structure in the aircraft, greatly reducing the weight, volume and structural complexity of the driver, it is very suitable for the application of electric vehicle. At the same time, when the water-cooled cooling structure is canceled, the motor can be installed close to the middle of the power board, which can further improve the structural compactness of the motor driver and reduce the overall volume and assembly difficulty of the driver.

Obviously, the above embodiments of the invention are only to clearly illustrate the examples made by the invention, not to limit the implementation mode of the invention. For ordinary technicians in the art, they can make various obvious changes, readjustments and replacements without leaving the protection scope of the invention. It is unnecessary and impossible to enumerate all the implementation methods here. Any modification, equivalent replacement and improvement made within the spirit and principle of the invention shall be included in the scope of protection of the claims of the invention.

What is claimed is:

1. A motor-driven power board, which is characterized in that it further includes:
   a PCB (printed circuit board) (10);
   a plurality of transistors (2) uniformly arranged along an edge of the PCB (10);
   a plurality of capacitors (6) disposed on the PCB (10) and are uniformly arranged along a side of the plurality of transistors (2) near a center of the PCB (10);
   a plurality of terminal posts (8) disposed on the PCB (10) and are uniformly arranged along the side of the plurality of transistors (2) near the center of the PCB (10), and are arranged between two adjacent capacitors (6) of said plurality of capacitors;
   a positive pole (3) of power bus disposed on the PCB;
   a negative pole (4) of power bus disposed on the PCB; and
   a signal wire (5) disposed on the PCB (10);
   wherein the plurality of transistors (2) are vertically disposed on a plane of the PCB (10), and wherein a heat dissipation surface of each of the plurality of transistors (2) is perpendicular to the plane of the PCB (10), and wherein the heat dissipation surface of each of the plurality of transistors (2) faces a periphery of the PCB (10).

2. The motor-driven power board of claim 1, wherein the PCB (10) is a hexagonal structure or a circular structure; the plurality of transistors (2) and the plurality of capacitors (6) are symmetrically disposed centering around the PCB (10).

3. A motor-driven power board, which is characterized in that it further includes:
   a PCB (printed circuit board) (10);
   a plurality of transistors (2) uniformly arranged along an edge of the PCB (10);
   a plurality of capacitors (6) disposed on the PCB (10) and are uniformly arranged along a side of the plurality of transistors (2) near a center of the PCB (10);
   a plurality of terminal posts (8) disposed on the PCB (10) and are uniformly arranged along the side of the plurality of transistors (2) near the center of the PCB (10), and are arranged between two adjacent capacitors (6) of said plurality of capacitors;
   a positive pole (3) of power bus disposed on the PCB;
   a negative pole (4) of power bus disposed on the PCB; and
   a signal wire (5) disposed on the PCB (10);
   wherein a conductive strip (7) is electrically coupled to a copper clad wire connecting the plurality of transistors (2) and the plurality of terminal posts (8).

4. The motor-driven power board of claim 3, wherein the conductive strip (7) is uniformly disposed along an inner side of each of the plurality of transistors (2) and an outer side of each of the plurality of capacitors (6).

5. The motor-driven power board of claim 3, wherein the plurality of transistors (2), the conductive strip (7) and the plurality of capacitors (6) are symmetrically disposed centering around the PCB (10).

6. The motor-driven power board of claim 3, wherein the conductive strip (7) is arranged on both a front and a back side of the PCB (10).

7. The motor-driven power board of claim 3, wherein the conductive strip (7) is a tinned copper strip bonded with the copper clad wire.

* * * * *